US 11,336,211 B2

(12) United States Patent
Nakabayashi et al.

(10) Patent No.: US 11,336,211 B2
(45) Date of Patent: May 17, 2022

(54) VIBRATION WAVE MOTOR AND DRIVING APPARATUS USING VIBRATION WAVE MOTOR

(71) Applicant: CANON KABUSHIKI KAISHA, Tokyo (JP)

(72) Inventors: Mai Nakabayashi, Abiko (JP); Ryo Yamasaki, Tokyo (JP); Yasufumi Yamamoto, Kawasaki (JP); Shunsuke Ninomiya, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 826 days.

(21) Appl. No.: 16/213,144

(22) Filed: Dec. 7, 2018

(65) Prior Publication Data
US 2019/0181777 A1 Jun. 13, 2019

(30) Foreign Application Priority Data

Dec. 8, 2017 (JP) .............................. JP2017-235870

(51) Int. Cl.
H02N 2/02 (2006.01)
H02N 2/04 (2006.01)
(Continued)

(52) U.S. Cl.
CPC ............. *H02N 2/026* (2013.01); *H02N 2/006* (2013.01); *H02N 2/0055* (2013.01);
(Continued)

(58) Field of Classification Search
CPC ...... H02N 2/026; H02N 2/0055; H02N 2/006; H02N 2/028; H02N 2/04; G02B 7/08; G03B 2205/0061; H01L 41/1876
See application file for complete search history.

(56) References Cited

U.S. PATENT DOCUMENTS 9,091,805 B2   7/2015  Yamasaki et al.
9,143,058 B2   9/2015  Oikawa et al.
(Continued)

FOREIGN PATENT DOCUMENTS

JP    2012-227988 A    11/2012
JP    2015-126692 A    7/2015
JP    2016-101022 A    5/2016

OTHER PUBLICATIONS

Office Action dated Apr. 2, 2019, in Japanese Patent Application No. 2017-235870.

Primary Examiner — Emily P Pham
(74) Attorney, Agent, or Firm — Venable LLP

(57) ABSTRACT

A vibration wave motor includes a vibrator; a first holding member configured to hold the vibrator; a second holding member; an elastic coupling member configured to couple the first holding member and the second holding member to each other; a friction member; and a pressurizing unit, wherein the vibrator and the friction member relatively move due to vibration of the vibrator, wherein the elastic coupling member includes a first coupling portion and a second coupling portion, and wherein one of the first coupling portion and the second coupling portion is arranged on a straight line that is parallel to a direction of the relative movement and passes through a pressurizing gravity center and another of the first coupling portion and the second coupling portion is arranged on a straight line that is orthogonal to the direction of the relative movement and passes through the pressurizing gravity center.

20 Claims, 6 Drawing Sheets

(51) Int. Cl.
*H02N 2/00* (2006.01)
*H01L 41/187* (2006.01)
*G02B 7/04* (2021.01)

(52) U.S. Cl.
CPC ............... *H02N 2/028* (2013.01); *H02N 2/04* (2013.01); *G02B 7/04* (2013.01); *G03B 2205/0061* (2013.01); *H01L 41/1876* (2013.01)

(56) References Cited

U.S. PATENT DOCUMENTS

| | | |
|---|---|---|
| 9,158,083 B2 | 10/2015 | Oikawa et al. |
| 9,641,104 B2 | 5/2017 | Yamasaki et al. |
| 9,827,593 B2 | 11/2017 | Yamamoto |
| 9,933,593 B2 | 4/2018 | Shiono |
| 10,103,650 B2 | 10/2018 | Ninomiya |
| 10,171,008 B2 | 1/2019 | Nishitani et al. |
| 2013/0293728 A1* | 11/2013 | Ohashi .................. H02N 2/0015 348/208.11 |
| 2017/0371125 A1 | 12/2017 | Ninomiya |

* cited by examiner

VIBRATION WAVE MOTOR AND DRIVING APPARATUS USING VIBRATION WAVE MOTOR

BACKGROUND OF THE INVENTION

Field of the Invention

The present invention relates to a vibration wave motor and a driving apparatus using the vibration wave motor.

Description of the Related Art

An ultrasonic motor having features of a small size and light weight, high driving force, a wide speed range, and quiet drive has been adopted in a lens barrel of an optical apparatus and the like. In an ultrasonic motor disclosed in Japanese Patent Application Laid-Open No. 2015-126692, a base having a vibrator fixed thereto and a vibrator holding member are coupled to each other through use of a plate spring provided therebetween without backlash by being urged in a relative movement direction. Further, according to description in Japanese Patent Application Laid-Open No. 2016-101022, an ultrasonic motor disclosed therein is configured to drive a drive part by generating larger driving force through use of a plurality of vibrators, for example, when the weight of the drive part is large.

SUMMARY OF THE INVENTION

When the mass of a member to be driven is large, it is required to increase the spring load of the plate spring in the ultrasonic motor in Japanese Patent Application Laid-Open No. 2015-126692. In this case, the increase in spring load degrades ease of assembly, and hence it is required to limit the spring load to a certain spring load. However, there is a problem in that it is required to suppress an acceleration degree at a time of acceleration and deceleration in order to limit the spring load, resulting in a decrease in average driving speed. Further, in the ultrasonic motor in Japanese Patent Application Laid-Open No. 2016-101022, when a plurality of vibrators are used, each vibrator needs to have a pressurizing unit, resulting in increase in number of parts.

A vibration wave motor according to an embodiment of the present invention includes: a vibrator including a piezoelectric element and a protruding portion; a first holding member configured to hold the vibrator; a second holding member, which is different from the first holding member; an elastic coupling member configured to couple the first holding member and the second holding member to each other; a friction member, which is to be brought into friction contact with the vibrator; and a pressurizing unit configured to pressurize the vibrator against the friction member. The vibrator and the friction member relatively move due to vibration of the vibrator. The elastic coupling member includes a first coupling portion to be coupled to the first holding member and a second coupling portion to be coupled to the second holding member. One of the first coupling portion and the second coupling portion is arranged on a straight line that is substantially parallel to a direction of the relative movement and passes through a pressurizing gravity center of the pressurizing unit, and another of the first coupling portion and the second coupling portion is arranged on a straight line that is substantially orthogonal to the direction of the relative movement and passes through the pressurizing gravity center.

Further features of the present invention will become apparent from the following description of exemplary embodiments with reference to the attached drawings.

DESCRIPTION OF THE EMBODIMENTS

Figure 1A:
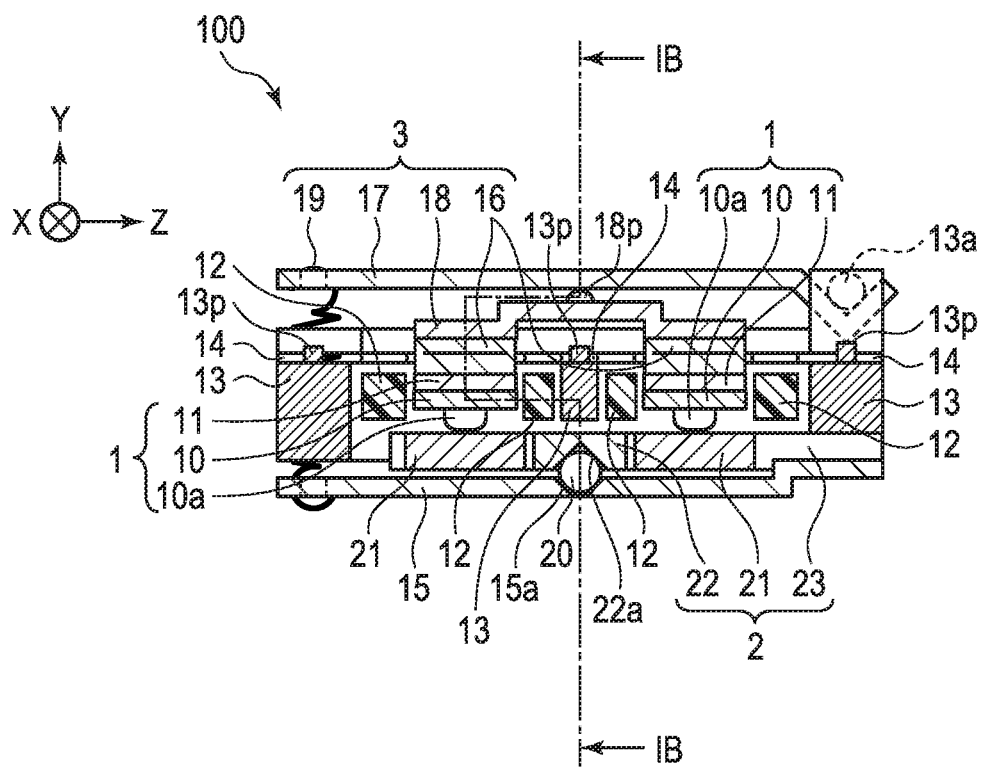
FIG. 1A and FIG. 1B are each a sectional view of a vibration wave motor 100 according to an embodiment of the present invention.

Preferred embodiments of the present invention will now be described in detail in accordance with the accompanying drawings.

In the drawings, like reference symbols denote like reference members. Further, in this specification, the direction in which a vibrator 1 and a friction member 21 (described later) relatively move is referred to as "X-direction". Further, the pressurizing direction of a pressurizing unit 3 (described later) is referred to as "Y-direction". Further, the direction perpendicular to the X-direction and the Y-direction is referred to as "Z-direction".

Figure 1B:
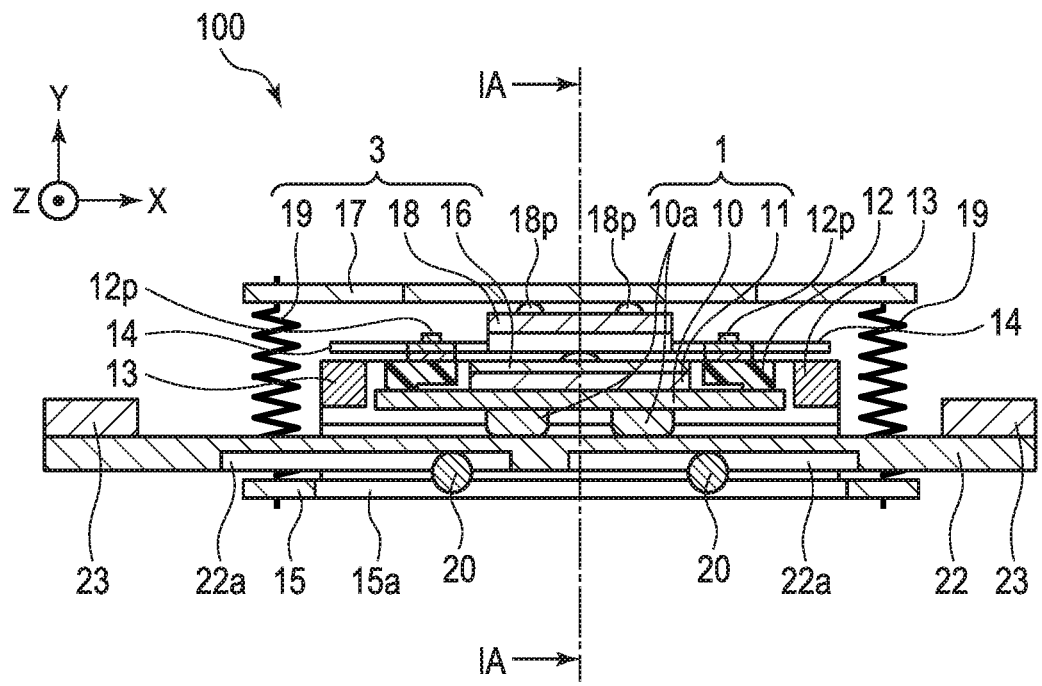
Figure 3:
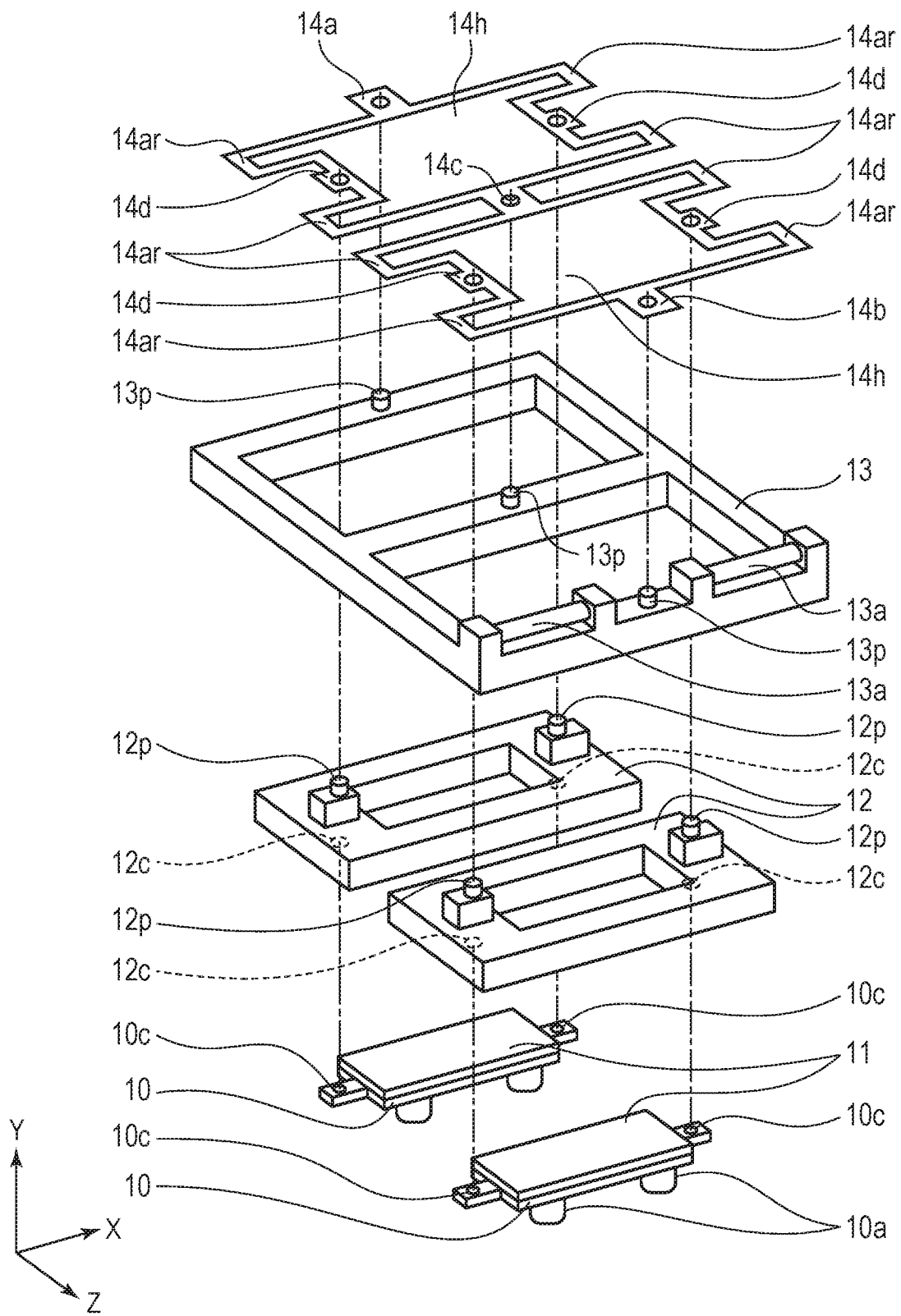
FIG. 3 is an exploded perspective view for illustrating coupling through use of the elastic coupling member 14 in the embodiment of the present invention.

First, the configuration of a vibration wave motor (ultrasonic motor) 100 according to an embodiment of the present invention is described with reference to FIG. 1A, FIG. 1B, and FIG. 3. FIG. 1A is a sectional view of the vibration wave motor 100 according to the embodiment of the present invention in a YZ-plane taken along the section line IA-IA of FIG. 1B. FIG. 1B is a sectional view taken along the section line IB-IB of FIG. 1A. Further, FIG. 3 is an exploded perspective view for illustrating coupling through use of an elastic coupling member 14.

The vibration wave motor 100 according to the embodiment of the present invention includes two vibrators 1. The vibrators 1 are each formed of a piezoelectric element 11 and a plate-like elastic body 10. The piezoelectric element 11 expands and contracts through the application of an AC voltage. The plate-like elastic body 10 adheres to the piezoelectric element 11. The piezoelectric element 11 is formed of a rectangular member made of lead zirconate titanate (PZT), and the elastic body 10 is formed of a plate member made of stainless steel. Materials of those members are not limited to those described above. When a predetermined AC voltage is applied to the vibrator 1, the vibrator 1 excites to generate high-frequency vibration (ultrasonic vibration) having a frequency of an ultrasonic region due to expansion and contraction of the piezoelectric element 11, thereby being capable of generating elliptic vibration at a distal end of a protruding portion 10a formed on the elastic body 10.

Each of the vibrators 1 is held by a frame-like holding member 12 (first holding member) made of a resin. The holding member 12 serves as a damping member, and is configured to suppress degradation in driving performance and generation of noise that are caused by the transmission of the ultrasonic vibration of the vibrator 1 to an outside. The holding member 12 configured to hold the vibrator 1 is coupled to a fixing member 13 (second holding member) through intermediation of the elastic coupling member 14. A connection portion between the holding member 12 and the elastic coupling member 14 and a connection portion between the fixing member 13 and the elastic coupling member 14 are fixed by a known fixing method such as use of an adhesive. However, the fixing method is not limited thereto. The fixing member 13 is fixed to a fixed portion (not shown) serving as a base portion of the vibration wave motor 100.

Two friction members 21, which are brought into friction contact with the protruding portions 10a of the vibrators 1, are arranged in the Z-direction so as to extend in a direction of relative movement. A moving-side rail member 22 is provided between the two friction members 21. The moving-side rail member 22 is fixed to a moving-side frame member 23 by a known fixing method such as use of a screw. The moving-side frame member 23 is connected to a member to be driven in order to output driving force of the vibration wave motor 100. A moving unit 2 includes the two friction members 21, the moving-side rail member 22, and the moving-side frame member 23.

Each of the vibrators 1 is pressurized against the friction member 21 by the pressurizing unit 3. The pressurizing unit 3 includes an elastic member 16, an upper pressure plate 17, a lower pressure plate 18, and a pressure spring 19. An elastic member 16 is arranged on a surface of each of the piezoelectric elements 11 on a side opposite to a surface to which the elastic body 10 is fixed. Further, one lower pressure plate 18 is provided on a surface of the elastic member 16 on a side opposite to a surface on which the elastic member 16 is brought into contact with the piezoelectric element 11. That is, the elastic member 16 is provided between the lower pressure plate 18 and the piezoelectric element 11, to thereby prevent the piezoelectric element 11 from being damaged. One lower pressure plate 18 is brought into contact with the elastic member 16 arranged on each of the vibrators 1 so that the lower pressure plate 18 extends across the two vibrators 1, and includes two protruding portions 18p protruding in the Y-direction along the X-direction. The upper pressure plate 17 is provided so as to be opposed to the two protruding portions 18p.

One end side of the upper pressure plate 17 in the Z-direction is engaged with the fixing member 13 with two hook portions 13a of the fixing member 13 being a rotation center, and the upper pressure plate 17 is brought into contact with the protruding portions 18p of the lower pressure plate 18. Further, another end side of the upper pressure plate 17 in the Z-direction is engaged with the pressure spring 19. One end portion of the pressure spring 19 acts on the upper pressure plate 17, and another end portion of the pressure spring 19 in the Y-direction acts on a fixed-side rail member 15. With this, pressurizing force of the vibrator 1 with respect to the friction member 21 is generated. With this pressurizing force, the protruding portion 10a is brought into friction contact with the friction member 21, and the friction member 21 relatively moves in the X-direction with respect to the vibrator 1 due to the elliptic movement of the distal end of the protruding portion 10a.

The fixing member 13 and the fixed-side rail member 15 are fixed to each other by a known fixing method such as use of a screw (not shown). However, there is no limitation on the method as long as the fixing member 13 and the fixed-side rail member 15 are fixed to each other. The fixed-side rail member 15 includes a fixed-side guide portion 15a having a V-groove shape along the X-direction, and the fixed-side guide portion 15a has two rolling balls 20 arranged thereon. Meanwhile, the moving-side rail member 22 includes two moving side guide portions 22a each having a groove shape along the X-direction. The rolling ball 20 is sandwiched between the moving side guide portion 22a of the moving-side rail member 22 and the fixed-side guide portion 15a of the fixed-side rail member 15. With this configuration, the moving unit 2 rotates about an axis in the X-direction passing through the center of the rolling ball 20 with respect to the fixed-side rail member 15, to thereby absorb displacement in the Y-direction of abutment points between the two vibrators 1 and the friction members 21, and a guide mechanism capable of traveling in a straight line in the X-direction is formed. Further, the fixed-side guide portion 15a having a V-groove shape, the moving side guide portion 22a, and the rolling ball 20 are arranged substantially at the center of the two vibrators 1 in the Z-direction.

Figure 2:
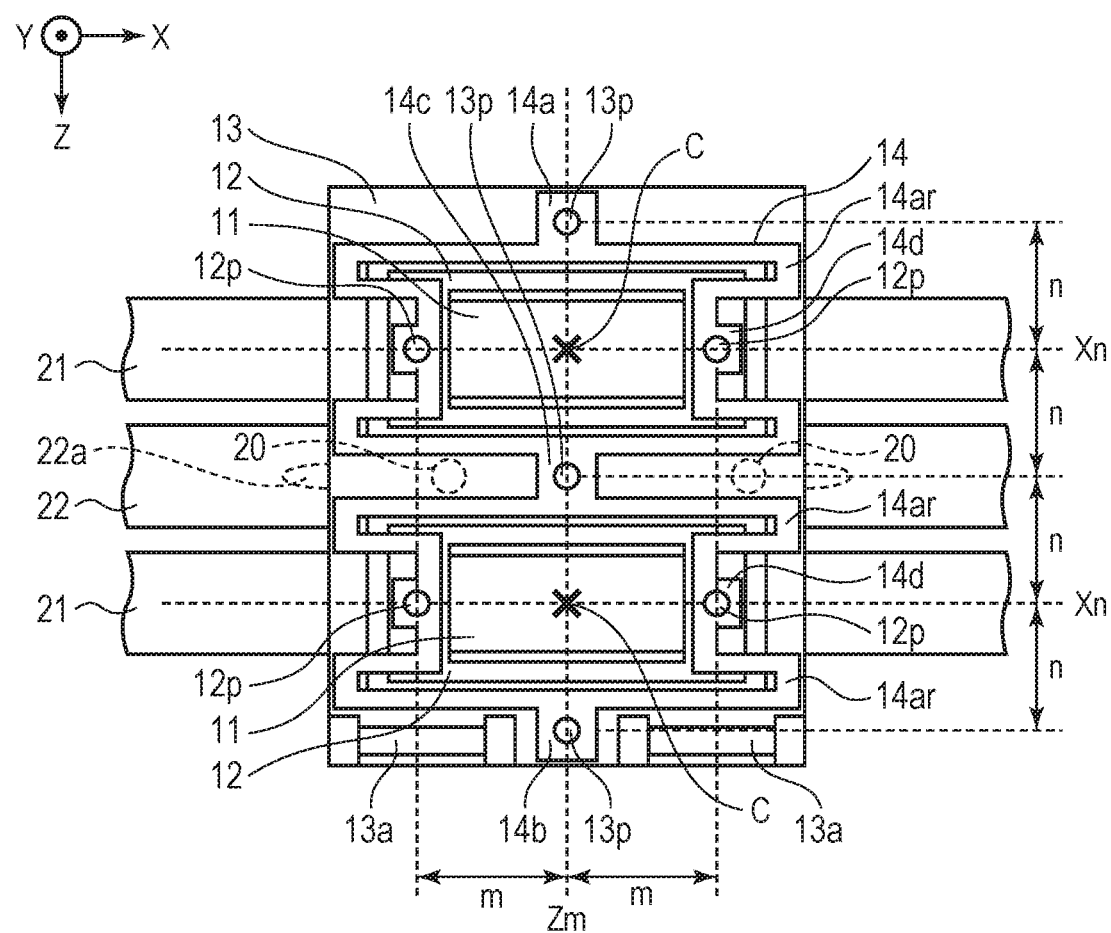
FIG. 2 is a plan view for illustrating coupling through use of an elastic coupling member 14 in the embodiment of the present invention.

Next, the configuration of the elastic coupling member 14 is described with reference to FIG. 2 and FIG. 3. FIG. 2 is a plan view of the vibration wave motor 100, and for the sake of description, the state in which the members forming the pressurizing unit 3 are omitted is illustrated. The elastic coupling member 14 is a member which is configured to couple the holding member 12 and the fixing member 13 to each other under a state in which the mechanical response delay caused by elastic deformation in the X-direction is suppressed to be extremely small, and in which the elastic coupling member 14 can be elastically deformed in the Y-direction.

The holding member 12 includes two protruding portions 12p protruding in the Y-direction along the X-direction. Further, the fixing member 13 includes three protruding portions 13p protruding in the Y-direction along the Z-direction. The elastic coupling member 14 includes a plurality of holding member coupling portions 14d (first coupling portions) to be coupled to the protruding portions 12P of the holding member 12, and a plurality of fixing member coupling portions 14a, 14b, and 14c (second coupling portions) to be coupled to the protruding portions 13p of the fixing member 13. Further, the elastic coupling member 14 includes a plurality of arm portions 14ar that extend so as to fold back in the X-direction, and a space surrounded by the two first coupling portions opposed to each other and the two second coupling portions opposed to each other (14a and 14c, and 14b and 14c) forms an opening 14h. The holding member coupling portion 14d, the fixing member coupling portions 14a, 14b, and 14c, and the arm portion 14ar are formed on the same plane orthogonal to the Y-direction. The arm portions 14ar are formed symmetrically with respect to an axis in the Z-direction passing through a pressurizing gravity center C of pressurizing force of the pressurizing unit 3. Further, each of the openings 14h includes the pressurizing gravity center C that enables the pressurizing force of the pressurizing unit 3 to be uniformly applied to the abutment points between the vibrators 1 and the friction member 21 in an XZ-plane orthogonal to the pressurizing direction of the pressurizing unit 3. With this configuration, each constituent member of the pressurizing unit 3 can apply a load to a surface of the piezoelectric element 11 including the pressurizing gravity center C without interfering with the elastic coupling member 14, to thereby apply stable pressurizing force to the abutment points.

Each of the holding member coupling portions 14d is formed on a straight line Xn that is substantially parallel to the X-direction and passes through the pressurizing gravity center C, and the fixing member coupling portions 14a, 14b, and 14c are formed on a straight line Zm that is substantially orthogonal to the X-direction and passes through the pressurizing gravity center C. Further, each of the holding member coupling portions 14d is formed at an equal distance "m" from the pressurizing gravity center C in the X-direction, and each of the fixing member coupling portions 14a, 14b, and 14c is formed at an equal distance "n" from the pressurizing gravity center C in the Z-direction. Further, each of the fixing member coupling portions 14a, 14b, and 14c is formed substantially in parallel to the direction (Z-direction) in which the two vibrators 1 are arranged on the same plane in the elastic coupling member 14. With this configuration, the fixing member coupling portion 14c between the two vibrators 1 is shared by the two vibrators 1, and the elastic coupling member 14 can be integrated. Therefore, downsizing in the direction (Z-direction) in which the two vibrators 1 are arranged can be performed. In the embodiment of the present invention, the holding member coupling portions 14d and the fixing member coupling portions 14a, 14b, and 14c are arranged as described above. However, the fixing member coupling portions 14a, 14b, and 14c may be arranged substantially in parallel to the X-direction. That is, any one of the holding member coupling portions 14d and the fixing member coupling portions 14a, 14b, and 14c may be formed on a straight line that is substantially parallel to the X-direction and passes through the pressurizing gravity center C, and another of the holding member coupling portions 14d and the fixing member coupling portions 14a, 14b, and 14c may be formed on a straight line that is substantially orthogonal to the X-direction and passes through the pressurizing gravity center C.

The piezoelectric element 11 is provided between the protruding portions 10a formed on the elastic body 10 of the vibrator 1 and the elastic coupling member 14. The elastic body 10 includes coupling portions 10c to be coupled to the holding member 12 in both end portions in the X-direction. As described above, the holding member 12 includes the two protruding portions 12p protruding in the Y-direction along the X-direction, and also includes vibrator coupling portions 12c to be coupled to the coupling portions 10c on a surface on a side opposite to the protruding portions 12p. That is, the holding member 12 includes the protruding portions 12p on one surface and the vibrator coupling portions 12c on another surface. With this configuration, the holding member coupling portions 14d can be connected to one surface of the holding member 12, and the vibrator 1 can be held on another surface (surface on an opposite side) thereof. Therefore, the holding member coupling portions 14d can be formed on a side of the pressurizing gravity center C in the X-direction. Further, when the arm portions 14ar of the elastic coupling member 14 are formed so as to extend to an upper surface of the fixing member 13, the holding member coupling portions 14d can be formed on the side of the pressurizing gravity center C in the X-direction, with the result that further downsizing in the X-direction can be performed.

In the embodiment of the present invention, two groups of the vibrator 1 and the friction member 21 are provided. The two groups of the vibrator 1 and the friction member 21 are arranged in the direction (Z-direction) that is substantially orthogonal to the X-direction. However, the two groups of the vibrator 1 and the friction member 21 may be arranged in a direction that is substantially parallel to the X-direction. Further, in the embodiment of the present invention, description is given of the case in which the two groups of the vibrator 1 and the friction member 21 are provided. However, the embodiment of the present invention is not limited thereto, and it is only required that at least one group be provided. Further, in the embodiment of the present invention, the friction member 21 is caused to relatively move as the moving unit 2 with the vibrator 1 being fixed. However, the vibrator 1 may be caused to move with the friction member 21 being fixed.

Figure 4A:
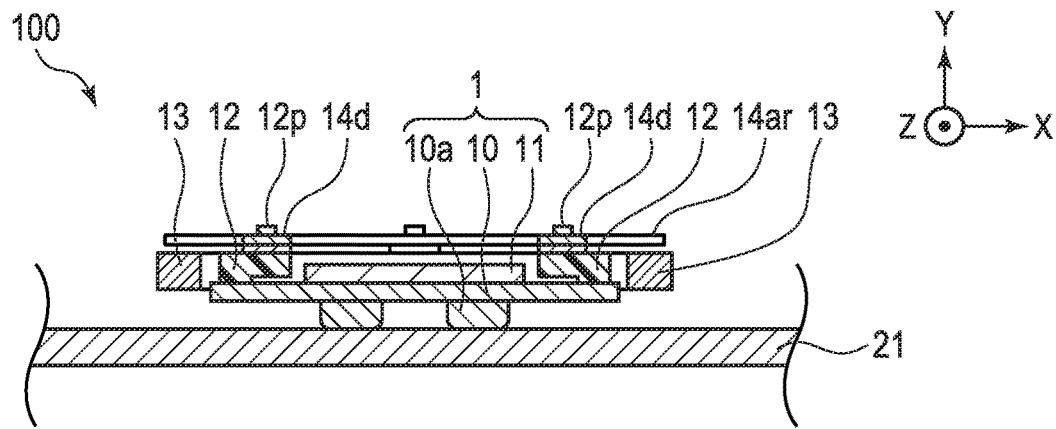
FIG. 4A, FIG. 4B, and FIG. 4C are each a view for illustrating an operation of the vibration wave motor 100 according to the embodiment of the present invention.
Figure 4B:
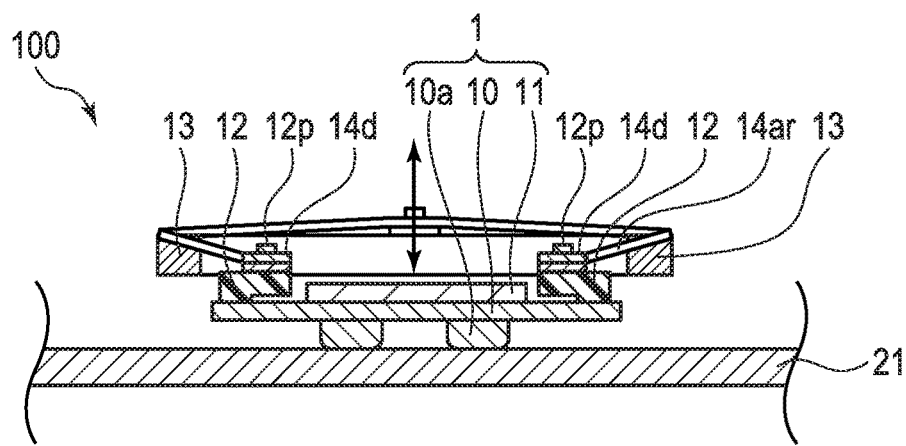
Figure 4C:
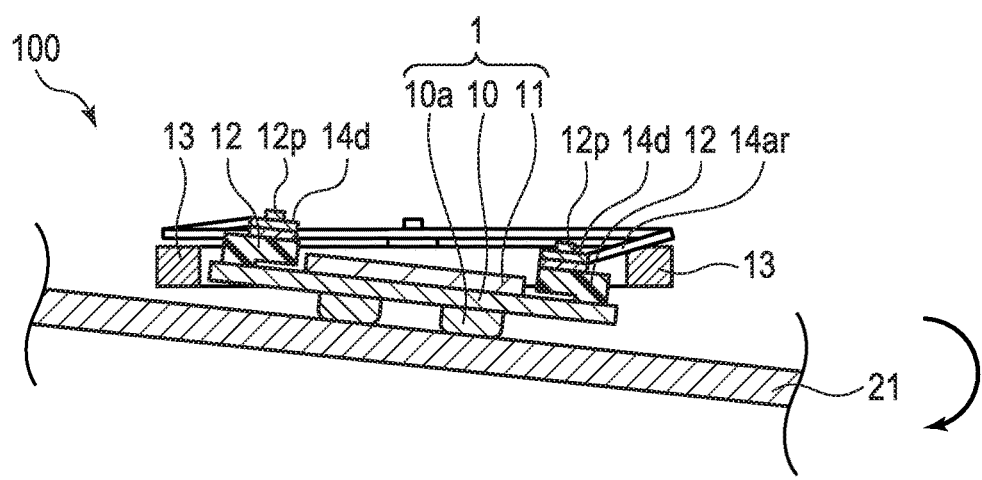

Next, the operation of the vibration wave motor 100 according to the embodiment of the present invention and the effect obtained therefrom are described with reference to FIG. 4A to FIG. 4C. FIG. 4A to FIG. 4C are each a sectional view for illustrating the vibration wave motor 100 illustrated in FIG. 1B in a further simplified manner. FIG. 4A is a view for illustrating a state in which each constituent element is arranged at the center in design. FIG. 4B is a view for illustrating a state in which the abutment points between the protruding portions 10a of the vibrator 1 and the friction member 21 are displaced from the center in design within a tolerance range in parallel to the Y-direction as indicated by the arrow. FIG. 4C is a view for illustrating a state in which the friction member 21 is tilted from the center in design within the tolerance range as indicated by the arrow.

Each of the holding member coupling portions 14d formed in the arm portion 14ar extending so as to fold back in the X-direction is freely movable in the Y-direction that is the pressurizing direction with respect to the fixing member coupling portions 14a, 14b, and 14c fixed to the fixing member 13. With this configuration, even when the abutment points between the protruding portions 10a and the friction member 21 are displaced from the center in design in the Y-direction, the arm portions 14ar are deformed to absorb the displacement in the Y-direction, and predetermined pressurizing force can be applied to the vibrator 1. Further, in the elastic coupling member 14, each of the holding member coupling portions 14d is formed on the straight line passing through the pressurizing gravity center C at the equal distance "m" from the pressurizing gravity center C, and each of the fixing member coupling portions 14a, 14b, and 14c is formed on the straight line passing through the pressurizing gravity center C at the equal distance "n" from the pressurizing gravity center C. With this, the vibrator 1 can rotate about an axis that is a straight line passing through the pressurizing gravity center C, which is substantially parallel to the Z-direction. Even when the friction member 21 is tilted from the center (even when the abutment points of the two protruding portions 10a that are brought into abutment against the friction member 21 are different in the Y-direction), displacement in the Y-direction is absorbed, and the vibrator 1 can be uniformly pressurized, with the result that the elliptic vibration of the protruding portions 10a can be efficiently converted into driving force. Further, when the holding member coupling portions 14d and the fixing member coupling portions 14a, 14b, and 14c are formed on the straight lines each passing through the pressurizing gravity center C, the number of components can be reduced, and ease of assembly can be ensured while the function of uniformly pressurizing the vibrator 1 is obtained.

When the arm portion 14ar is formed so as to fold back in the X-direction, and further, the holding member coupling portions 14d and the fixing member coupling portions 14a, 14b, and 14c are formed on the same plane orthogonal to the Y-direction, the stiffness in the X-direction can be enhanced.

The stiffness of the elastic coupling member 14 can be determined by a material, thickness, and width and length of the arm portion 14ar, and the stiffness of the elastic coupling member 14 can be set to be sufficiently large with respect to inertial force. With this, even when the mass of the member to be driven is large, the mechanical response delay caused by elastic deformation of the elastic coupling member 14 in the X-direction can be suppressed to be extremely small. Thus, according to the present invention, the vibration wave motor 100 can be provided, which is capable of maintaining an average driving speed without decreasing an acceleration degree at a time of acceleration and deceleration while ensuring control performance, even when the mass of the member to be driven is large. In particular, the vibration wave motor 100 can be provided for a linear motor.

Application Example 1

Figure 5:
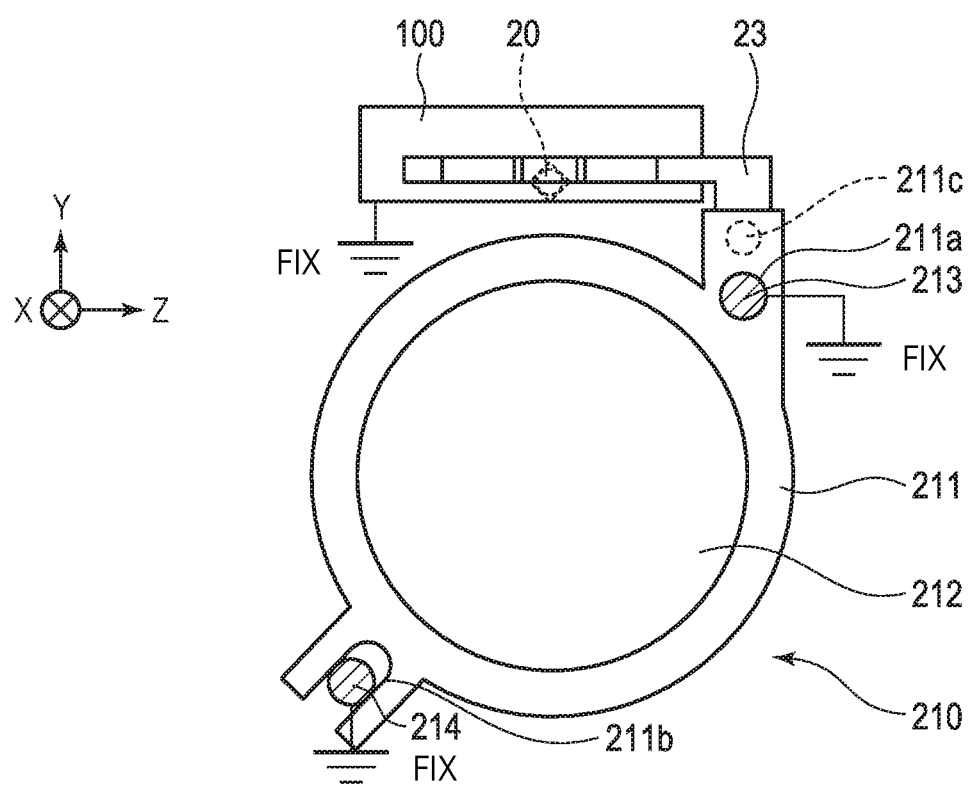
FIG. 5 is a view for illustrating a configuration of a lens driving apparatus 210 in the embodiment of the present invention.

Next, the configuration and operation of a lens driving apparatus 210 according to Application Example 1 employing the vibration wave motor 100 according to the embodiment of the present invention are described with reference to FIG. 5. FIG. 5 is a view of the lens driving apparatus 210, in which the vibration wave motor 100 is incorporated, when viewed in the optical axis direction (X-direction).

The moving-side frame member 23 of the vibration wave motor 100 is connected to a lens holder 211 through a connecting portion 211c formed in the lens holder 211. The lens holder 211 is configured to hold an optical lens 212, and is fitted with a first guide bar 213 in a guide portion 211a formed in the lens holder 211 to be guided in a straight line in the X-direction. The first guide bar 213 is fixed to a fixed portion (not shown) as indicated by "FIX" in FIG. 5. Further, the lens holder 211 has an elongated hole 211b at a position that is substantially opposed to the guide portion 211a, and the elongated hole 211b is fitted with a second guide bar 214 that is a member configured to regulate rotation of the lens holder 211. The second guide bar 214 is also fixed to a fixed portion (not shown) as indicated by "FIX" in FIG. 5. With this, the lens holder 211 is regulated for rotation, and hence is guided in a straight line in the X-direction without rotating.

Next, the function and effect of the lens driving apparatus 210 using the vibration wave motor 100 according to the embodiment of the present invention are described. In order to drive the member to be driven including the optical lens 212 having a large mass without decreasing an acceleration degree at a time of acceleration and deceleration, the vibration wave motor 100 having a configuration without mechanical response delay caused by elastic deformation in the X-direction is required. Through use of the vibration wave motor 100 according to the embodiment of the present invention, the lens driving apparatus 210 can be provided, which is capable of maintaining an average driving speed without decreasing an acceleration degree at a time of acceleration and deceleration while ensuring control performance even with respect to the member to be driven including the optical lens 212 having a large mass.

In the embodiment of the present invention, the member to be driven including the optical lens 212 can be driven by the vibration wave motor 100, but the member to be driven is not limited thereto. The lens driving apparatus 210 employing the vibration wave motor 100 according to the embodiment of the present invention is described above.

Application Example 2

Figure 6:
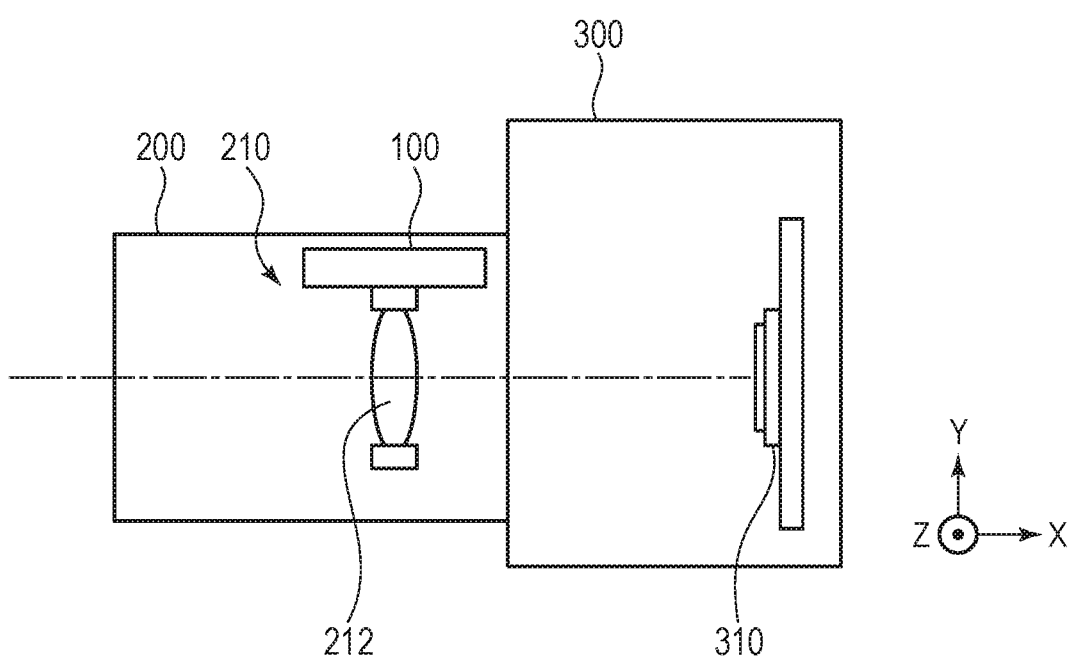
FIG. 6 is a view for illustrating a configuration of an image pickup apparatus in the embodiment of the present invention.

Next, the configuration of an image pickup apparatus according to Application Example 2 employing the lens driving apparatus 210 including the vibration wave motor 100 according to the embodiment of the present invention is described with reference to FIG. 6. In FIG. 6, an image pickup apparatus main body includes an image pickup lens unit 200 and a camera body 300. The camera body 300 includes an image pickup element 310, and the lens driving apparatus 210 is built in the image pickup lens unit 200. The vibration wave motor 100 provided in the lens driving apparatus 210 can drive the optical lens 212 being a focusing lens substantially in parallel to the X-direction that is an optical axis direction. The optical lens 212 being a focusing lens is moved in a direction that is substantially parallel to an optical axis at a time of image pickup, and a subject image is formed at a position of the image pickup element 310, thereby being capable of generating a focused image.

The lens driving apparatus 210 including the vibration wave motor 100 according to the embodiment of the present invention is mounted on the image pickup apparatus, but the present invention is not limited to this configuration. Further, in Application Example 2 of the present invention, the image pickup apparatus includes the image pickup lens unit 200 and the camera body 300 in an integrated manner, but the image pickup lens unit 200 may be a replaceable lens.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-235870, filed Dec. 8, 2017, which is hereby incorporated by reference herein in its entirety.

What is claimed is:

1. A vibration wave motor comprising:
   a vibrator including a piezoelectric element and a protruding portion;
   a first holding member configured to hold the vibrator;
   a second holding member, which is different from the first holding member;
   an elastic coupling member configured to couple the first holding member and the second holding member to each other;
   a friction member, which is to be brought into friction contact with the vibrator; and
   a pressurizing unit configured to pressurize the vibrator against the friction member,
   wherein the vibrator and the friction member relatively move due to vibration of the vibrator,
   wherein the elastic coupling member includes a first coupling portion to be coupled to the first holding member and a second coupling portion to be coupled to the second holding member, and
   wherein one of the first coupling portion and the second coupling portion is arranged on a straight line that is substantially parallel to a direction of a relative movement of the vibrator and the friction member and passes through a pressurizing gravity center of the pressurizing unit, and another of the first coupling portion and the second coupling portion is arranged on a straight line that is substantially orthogonal to the direction of the relative movement and passes through the pressurizing gravity center.

2. The vibration wave motor according to claim 1, wherein the elastic coupling member further includes an arm portion extending so as to fold back in a direction of the relative movement, and wherein the arm portion, the first coupling portion, and the second coupling portion are arranged on the same plane orthogonal to a direction of the pressurization.

3. The vibration wave motor according to claim 1, wherein the elastic coupling member further includes an opening, and
wherein the opening is formed in a region including the pressurizing gravity center in a plane orthogonal to the direction of the pressurization.

4. The vibration wave motor according to claim 1, wherein the piezoelectric element is provided between the protruding portion of the vibrator and the elastic coupling member.

5. The vibration wave motor according to claim 1, wherein the pressurizing unit is provided singular in number.

6. The vibration wave motor according to claim 1, wherein a plurality of first coupling portions and a plurality of second coupling portions are each arranged at an equal distance from the pressurizing gravity center.

7. The vibration wave motor according to claim 1, wherein the first coupling portion is arranged on the straight line that is substantially parallel to the direction of the relative movement.

8. The vibration wave motor according to claim 1, wherein the first holding member includes a vibrator coupling portion to be coupled to the vibrator, and
wherein the first coupling portion is arranged on a side of the pressurizing gravity center and aligned with the vibrator coupling portion.

9. The vibration wave motor according to claim 1, wherein the elastic coupling member is arranged in a plane of the second holding member orthogonal to the direction of the pressurization.

10. The vibration wave motor according to claim 1, wherein at least one vibrator is arranged along one of a direction that is substantially parallel to the direction of the relative movement and a direction that is substantially orthogonal to the direction of the relative movement, and
wherein the second coupling portion is arranged substantially parallel to a direction of arrangement of the vibrator.

11. A driving apparatus comprising:
a vibration wave motor including:
a vibrator including a piezoelectric element and a protruding portion;
a first holding member configured to hold the vibrator;
a second holding member, which is different from the first holding member;
an elastic coupling member configured to couple the first holding member and the second holding member to each other;
a friction member, which is to be brought into friction contact with the vibrator; and
a pressurizing unit configured to pressurize the vibrator against the friction member; and
a member to be driven,
wherein the vibrator and the friction member relatively move due to vibration of the vibrator,
wherein the elastic coupling member includes a first coupling portion to be coupled to the first holding member and a second coupling portion to be coupled to the second holding member,
wherein one of the first coupling portion and the second coupling portion is arranged on a straight line that is substantially parallel to a direction of a relative movement of the vibrator and the friction member and passes through a pressurizing gravity center of the pressurizing unit, and another of the first coupling portion and the second coupling portion is arranged on a straight line that is substantially orthogonal to the direction of the relative movement and passes through the pressurizing gravity center, and
wherein the member to be driven moves due to the relative movement of the vibrator and the friction member.

12. The driving apparatus according to claim 11, wherein the member to be driven comprises an optical lens, and
wherein the optical lens moves in an optical axis direction due to the relative movement of the vibrator and the friction member.

13. A vibration wave motor comprising:
a vibrator including a piezoelectric element and a protruding portion;
a first holding member configured to hold the vibrator;
a second holding member configured to hold the first holding member through intermediation of a coupling member; and
a pressurizing member configured to bring the vibrator and a friction member into pressurized contact with each other,
wherein the vibrator and the friction member relatively move due to vibration of the vibrator,
wherein the coupling member includes a first coupling portion to be coupled to the first holding member, a second coupling portion to be coupled to the second holding member, and an arm portion that is configured to connect the first coupling portion and the second coupling portion to each other and is elastically deformed in a pressurizing direction of the pressurizing member,
wherein the first holding member is coupled to the first coupling portion on a side opposite to a side on which the vibrator is held in a direction parallel to the pressurizing direction of the pressurizing member, and
wherein the second coupling portion of the coupling member is coupled to the second holding member on a side on which the first coupling portion is coupled to the first holding member in the direction parallel to the pressurizing direction of the pressurizing member.

14. The vibration wave motor according to claim 13, wherein the second holding member has an opening, and
wherein the first holding member is arranged in the opening of the second holding member.

15. A driving apparatus comprising:
a vibration wave motor including:
a vibrator including a piezoelectric element and a protruding portion;
a first holding member configured to hold the vibrator;
a second holding member configured to hold the first holding member through intermediation of a coupling member; and
a pressurizing member configured to bring the vibrator and a friction member into pressurized contact with each other; and
a member to be driven,
wherein the vibrator and the friction member relatively move due to vibration of the vibrator,
wherein the coupling member includes a first coupling portion to be coupled to the first holding member, a second coupling portion to be coupled to the second holding member, and an arm portion that is configured to connect the first coupling portion and the second coupling portion to each other and is elastically deformed in a pressurizing direction of the pressurizing member, wherein the first holding member is coupled to the first coupling portion on a side opposite to a side on which the vibrator is held in a direction parallel to the pressurizing direction of the pressurizing member, wherein the second coupling portion of the coupling member is coupled to the second holding member on a side on which the first coupling portion is coupled to the first holding member in the direction parallel to the pressurizing direction of the pressurizing member, and wherein the member to be driven moves due to a relative movement of the vibrator and the friction member.

16. The driving apparatus according to claim 15, wherein the member to be driven comprises an optical lens, and wherein the optical lens moves in an optical axis direction due to the relative movement of the vibrator and the friction member.

17. A vibration wave motor comprising:

a vibrator including a piezoelectric element and a protruding portion;

a first holding member configured to hold the vibrator;

a second holding member configured to hold the first holding member through intermediation of a coupling member; and a pressurizing member configured to bring the vibrator and a friction member into pressurized contact with each other, wherein the vibrator and the friction member relatively move due to vibration of the vibrator, wherein the coupling member includes a first coupling portion to be coupled to the first holding member, a second coupling portion to be coupled to the second holding member, and an arm portion that is configured to connect the first coupling portion and the second coupling portion to each other and is elastically deformed in a pressurizing direction of the pressurizing member, and wherein the first holding member and the second holding member are arranged between the coupling member and the vibrator in a direction parallel to the pressurizing direction of the pressurizing member.

18. The vibration wave motor according to claim 17, wherein the second holding member has an opening, and wherein the first holding member is arranged in the opening of the second holding member.

19. A driving apparatus comprising:

a vibration wave motor including:

a vibrator including a piezoelectric element and a protruding portion;

a first holding member configured to hold the vibrator;

a second holding member configured to hold the first holding member through intermediation of a coupling member; and a pressurizing member configured to bring the vibrator and a friction member into pressurized contact with each other; and a member to be driven, wherein the vibrator and the friction member relatively move due to vibration of the vibrator, wherein the coupling member includes a first coupling portion to be coupled to the first holding member, a second coupling portion to be coupled to the second holding member, and an arm portion that is configured to connect the first coupling portion and the second coupling portion to each other and is elastically deformed in a pressurizing direction of the pressurizing member, wherein the first holding member and the second holding member are arranged between the coupling member and the vibrator in a direction parallel to the pressurizing direction of the pressurizing member, and wherein the member to be driven moves due to a relative movement of the vibrator and the friction member.

20. The driving apparatus according to claim 19, wherein the member to be driven comprises an optical lens, and wherein the optical lens moves in an optical axis direction due to the relative movement of the vibrator and the friction member.

* * * * *